(12) United States Patent
Wang et al.

(10) Patent No.: US 12,360,153 B2
(45) Date of Patent: Jul. 15, 2025

(54) IN-LINE DEVICE ELECTRICAL PROPERTY ESTIMATING METHOD AND TEST STRUCTURE OF THE SAME

(71) Applicant: Taiwan Semiconductor Manufacturing Company Limited, Hsin-Chu (TW)

(72) Inventors: Chen-Han Wang, Hsinchu (TW); Chun-Hsiung Lin, Hsinchu (TW)

(73) Assignee: Taiwan Semiconductor Manufacturing Company Limited, Hsin-Chu (TW)

(*) Notice: Subject to any disclaimer, the term of this patent is extended or adjusted under 35 U.S.C. 154(b) by 274 days.

(21) Appl. No.: 17/971,724

(22) Filed: Oct. 24, 2022

(65) Prior Publication Data

US 2023/0043999 A1     Feb. 9, 2023

Related U.S. Application Data

(62) Division of application No. 15/182,577, filed on Jun. 14, 2016, now Pat. No. 11,480,606.

(51) Int. Cl.
*H01L 21/66* (2006.01)
*G01R 31/265* (2006.01)
*G01R 31/307* (2006.01)

(52) U.S. Cl.
CPC .......... *G01R 31/2653* (2013.01); *H01L 22/14* (2013.01); *H01L 22/30* (2013.01); *G01R 31/307* (2013.01); *H01L 22/34* (2013.01)

(58) Field of Classification Search
CPC ... G01R 31/2653; G01R 31/307; H01L 22/14; H01L 22/30; H01L 22/34
See application file for complete search history.

(56) References Cited

U.S. PATENT DOCUMENTS

| | | | |
|---|---|---|---|
| 4,212,082 A | 7/1980 | Barber et al. | |
| 6,150,669 A | 11/2000 | Nandakumar et al. | |
| 7,075,074 B2 | 7/2006 | Nam-Koong | |
| 2003/0049872 A1* | 3/2003 | Look | H01L 22/34 438/14 |
| 2006/0006474 A1* | 1/2006 | Tsuboi | H10D 89/10 257/E21.59 |
| 2007/0051948 A1* | 3/2007 | Fales | H01L 22/32 257/48 |
| 2008/0085570 A1* | 4/2008 | Sultan | H01L 22/12 257/E21.531 |

(Continued)

FOREIGN PATENT DOCUMENTS

| | | |
|---|---|---|
| CN | 107068696 A | 8/2017 |
| EP | 1480034 B1 | 8/2006 |

(Continued)

*Primary Examiner* — Joshua Benitez Rosario
*Assistant Examiner* — Scott E Bauman
(74) *Attorney, Agent, or Firm* — Cooper Legal Group, LLC

(57) ABSTRACT

A method for estimating at least one electrical property of a semiconductor device is provided. The method includes forming the semiconductor device and at least one testing unit on a substrate, irradiating the testing unit with at least one electron beam, estimating electrons from the testing unit induced by the electron beam, and estimating the electrical property of the semiconductor device according to intensity of the estimated electrons from the testing unit.

20 Claims, 17 Drawing Sheets

(56) References Cited

U.S. PATENT DOCUMENTS

| | | | |
|---|---|---|---|
| 2008/0217612 A1* | 9/2008 | Patterson | H01L 22/34 |
| | | | 257/48 |
| 2009/0079023 A1 | 3/2009 | Berthold et al. | |
| 2009/0101976 A1 | 4/2009 | Madhavan et al. | |
| 2009/0102501 A1* | 4/2009 | Guldi | H01L 22/34 |
| | | | 324/762.1 |
| 2010/0013515 A1 | 1/2010 | Jung | |
| 2010/0148235 A1* | 6/2010 | Toubou | H10D 89/10 |
| | | | 257/296 |
| 2011/0148466 A1* | 6/2011 | Aton | H10D 84/811 |
| | | | 326/103 |
| 2012/0074980 A1* | 3/2012 | Choi | H01L 22/34 |
| | | | 324/762.01 |
| 2012/0168751 A1 | 7/2012 | Tseng et al. | |
| 2013/0026465 A1* | 1/2013 | Chang | H10D 84/038 |
| | | | 257/E21.409 |
| 2013/0173214 A1* | 7/2013 | Yamashita | G01B 7/023 |
| | | | 702/170 |
| 2015/0287718 A1* | 10/2015 | Shim | H10D 62/127 |
| | | | 257/369 |
| 2016/0126149 A1 | 5/2016 | Zelsacher et al. | |
| 2017/0356953 A1* | 12/2017 | Wang | H01L 22/30 |

FOREIGN PATENT DOCUMENTS

| | | |
|---|---|---|
| TW | 468041 B | 12/2001 |
| TW | 200712516 A | 4/2007 |
| TW | 201423128 A | 6/2014 |
| WO | 2016002003 A1 | 1/2016 |

\* cited by examiner

IN-LINE DEVICE ELECTRICAL PROPERTY ESTIMATING METHOD AND TEST STRUCTURE OF THE SAME

RELATED APPLICATIONS

This application is a divisional of U.S. patent application Ser. No. 15/182,577, filed on Jun. 14, 2016, which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. Accompanying with such development, critical dimensions of lines and spacings between the lines and ends of lines are also scaled down. However, the reduced spacings between gates of transistors and ends of gates may cause occurrences of bridging defects to increase, and leakage currents to tunnel through dielectric material in the spacings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
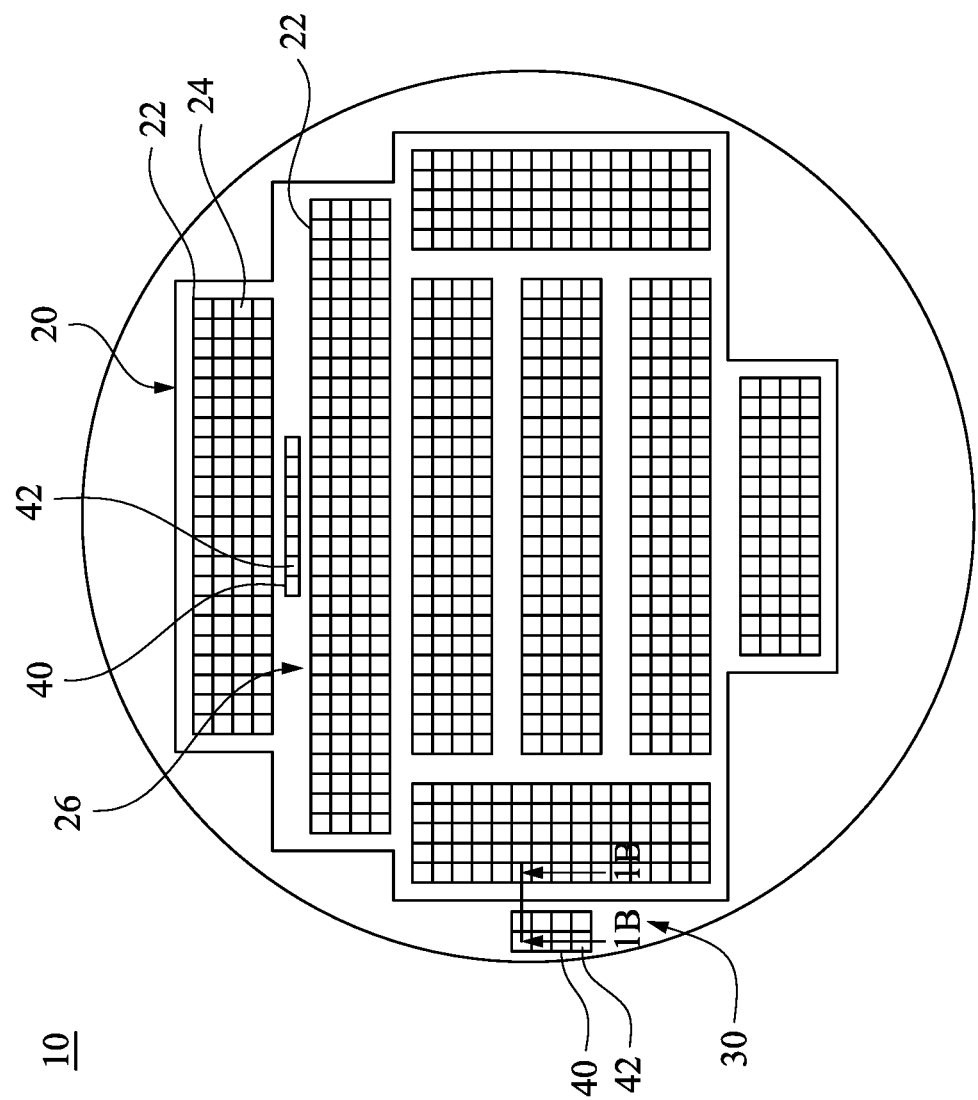
FIG. 1A is a schematic top view of a wafer, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is related to a method of in-line estimating electrical property of a semiconductor device and a test structure for the estimating method. The test structure is formed on a semiconductor substrate with substantially the same processes for fabricating the semiconductor device, such that the electrical property of the test structure may represent the electrical property of the semiconductor device. The test structure can be estimated before interconnection structures are formed to the semiconductor device, thus the device defects, such as splits or vacancies can be checked immediately.

FIG. 1A is a schematic top view of a wafer according to some embodiments of the present disclosure. The wafer 10 includes a product zone 20 and a peripheral zone 30, in which at least one die area 22 is present at the product zone 20. A plurality of semiconductor devices 24 are fabricated within the die area 22. At least one test structure 40 having a plurality of test units 42 is fabricated external the die area 22. In some embodiments, the test structure 40 is present at the peripheral zone 30 of the wafer. In some other embodiments, the test structure 40 is present at a scribe region 26 of the wafer 10, in which the scribe region 26 is present between the die areas 22.

The test units 42 and the semiconductor devices 24 are formed by using substantially the same fabricating processes. For example, the test units 42 and the semiconductor devices 24 are formed at least partially simultaneously. The test units 42 and the semiconductor devices 24 are formed using at least partially the same recipe. As a result, the electrical property of the test units 42 may represent the electrical property of the semiconductor devices 24.

Figure 1B:
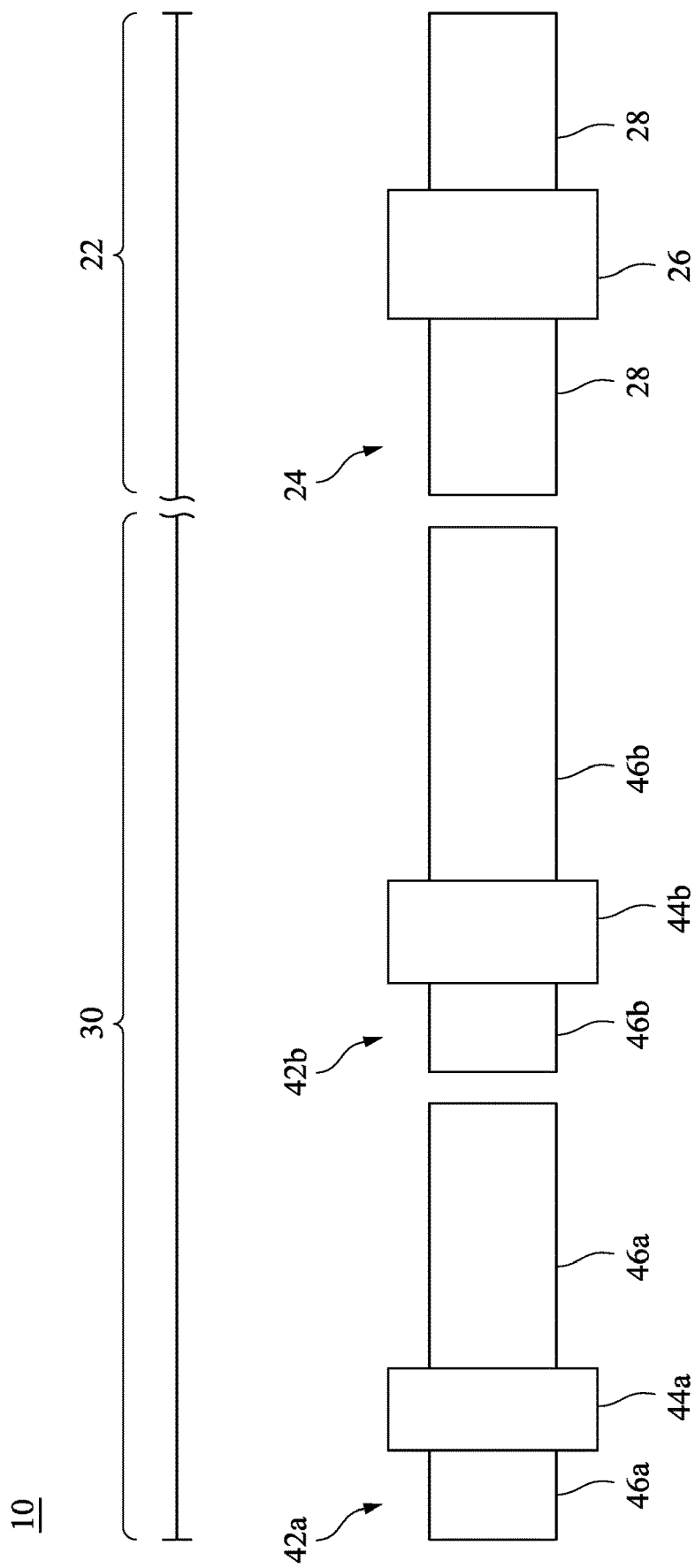
FIG. 1B is a local cross-sectional view of the wafer in FIG. 1A.

Referring to FIG. 1B, which is a local cross-sectional view of the wafer 10 in FIG. 1A, in which FIG. 1B is taken along line 1B-1B in FIG. 1A. The wafer 10 includes the semiconductor device 24, and the test units 42a and 42b. The semiconductor device 24 is formed at the die area 22, and the test units 42a and 42b are formed at the peripheral zone 30, for example. The semiconductor device 24 includes a device active region 28, and a device gate region 26 present on the device active region 28. The test unit 42a includes a test active region 46a, and a test gate region 44a present on the test active region 44a. The test unit 42b includes a test active region 46b, and a test gate region 44b present on the test active region 46b. The device active region 28 and the test active regions 46a and 46b are formed at least partially simultaneously. The device active region 28 and the test active regions 46a and 46b are formed are formed using at least partially the same recipe. The device gate region 26 and the test gate regions 44a and 44b are formed at least partially simultaneously. The device gate region 26 and the test gate regions 44a and 44b are formed are formed using at least partially the same recipe. The test units 42a and 42b are designed to have different layouts. Details of the test structure and methodology of estimating the electrical property of the semiconductor device 24 are discussed in the following embodiments.

Figure 2A:
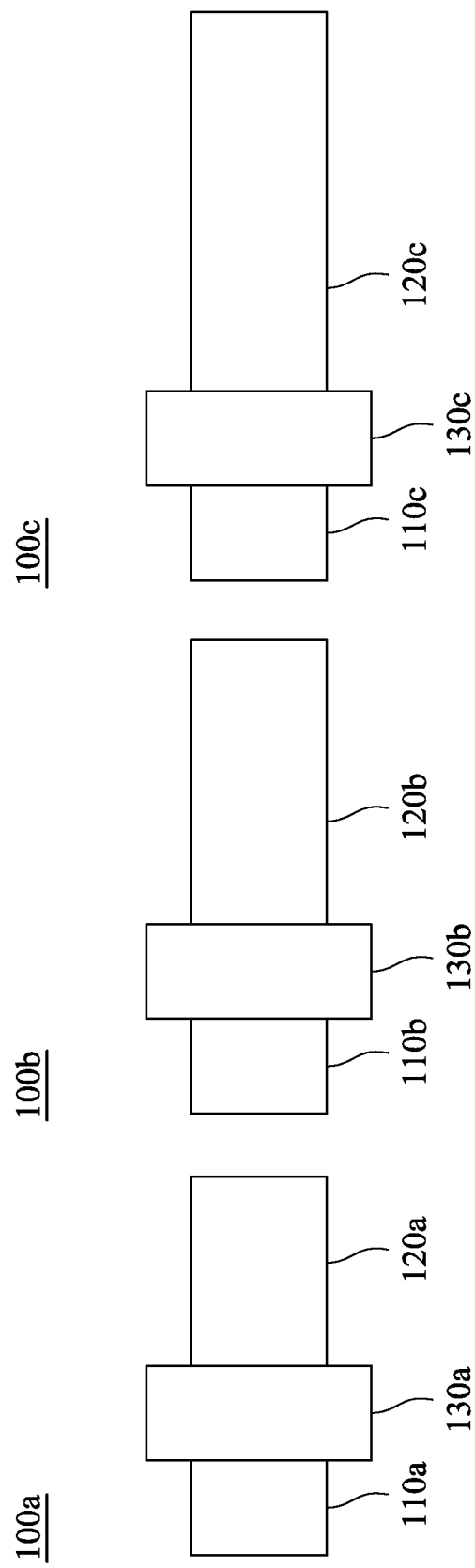
FIG. 2A and FIG. 2B respectively are top view and cross-sectional view of a test structure, in accordance with some embodiments of the present disclosure.
Figure 2B:
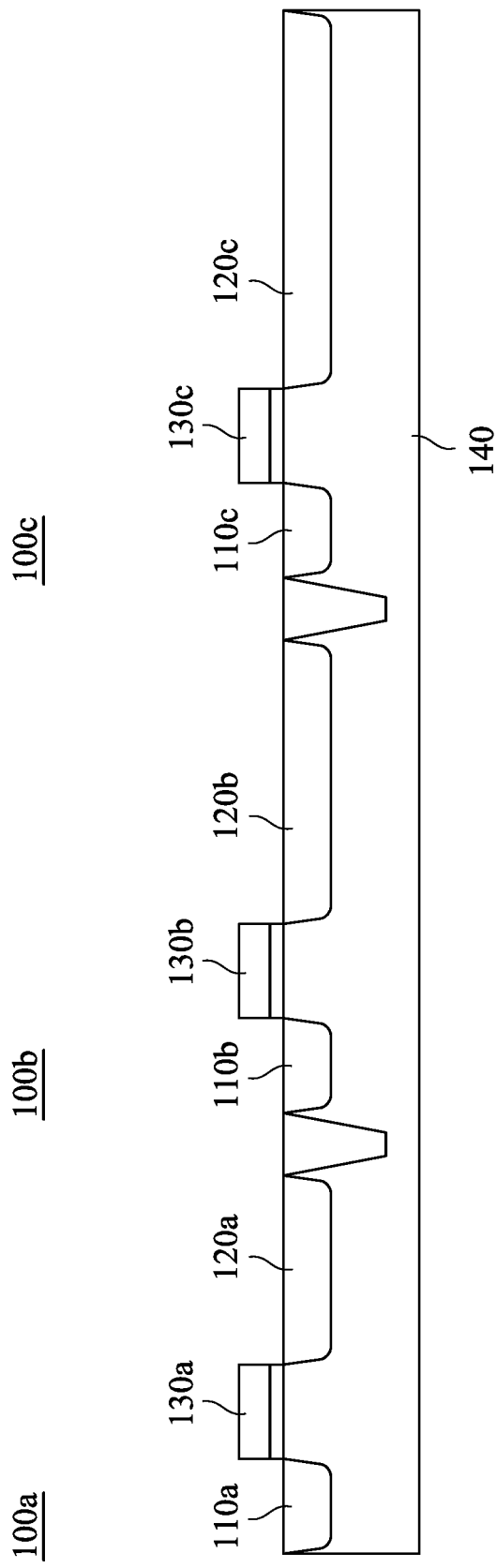

FIG. 2A and FIG. 2B respectively are top view and cross-sectional view of a test structure, in accordance with some embodiments of the present disclosure. A test structure is provided. The test structure includes a plurality of test units, such as test unit 100a-100c formed on a semiconductor substrate 140. The test units 100a-100c are arranged at least in a row or in a column. The test units 100a-100c respectively include active regions, and gate region 130a-130c present thereon, and the active regions are asymmetric to the gate regions 130a-130c.

For example, the test unit 100a includes a source region 110a, a drain region 120a, and a gate region 130a, in which the gate region 130a is present between the source region 110a and the drain region 120a, and the area of the drain region 120a is larger than the area of the source region 110a. The test unit 100b includes a source region 110b, a drain region 120b, and a gate region 130b, in which the gate region 130b is present between the source region 110b and the drain region 120b, and the area of the drain region 120b is larger than the area of the source region 110b. The test unit 100c includes a source region 110c, a drain region 120c, and a gate region 130c, in which the gate region 130c is present between the source region 110c and the drain region 120c, and the area of the drain region 120c is larger than the area of the source region 110c. In some embodiments, the gate regions 130a-130c are in a linear shape, and the gate regions 130a-130c have substantially the same and sufficient large area.

In some embodiments, the source regions 110a-110c have substantially the same area, the area of the drain region 120c is larger than the area of the drain region 120b, and the area of the drain region 120b is larger than the area of the drain region 120a. In some embodiments, the area difference between the source region 110c and the drain region 120c the test unit 100c is larger than the area difference between the source region 110b and the drain region 120b of the test unit 100b, and the area difference between the source region 110b and the drain region 120b of the test unit 100b is larger than the area difference between the source region 110a and the drain region 120a of the test unit 100a.

The test units 100a-100c are fabricated with substantially the same processes for fabricating the semiconductor device, such as metal-oxide-semiconductor (MOS) transistors, such that the electrical property of the test units 100a-100c may represent the electrical property of the semiconductor device. In some embodiments, the semiconductor device can be an N-type device. The semiconductor substrate 140 may be made of a semiconductor material, such as silicon, silicon carbide (SiC), silicon germanium (SiGe), an III-V compound semiconductor, or combinations thereof. The semiconductor substrate 140 may include a P-type well, and the source regions 110a-110c and the drain regions 120a-120c can be N-type active regions in the P-type well. The semiconductor substrate 140 further includes a plurality of shallow trench isolations to separate the test units 100a-100c. The N-type active regions can be lightly-doped drain/source (LDD) regions. The N-type active regions can be formed by implanting an N-type impurity (such as phosphorous and/or arsenic) into the semiconductor substrate 140. In some other embodiments, the source regions 110a-110c and the drain regions 120a-120c can be epitaxy structures, depend on the semiconductor device.

The gate regions 130a-130c are formed on the semiconductor substrate 140 and are respectively present between the source regions 110a-110c and the drain regions 120a-120c. The gate regions 130a-130c respectively include gate stacks and gate dielectrics between the gate stacks and the semiconductor substrate 140. The gate stacks of the gate regions 130a-130c are made of metal containing material. In some embodiments, the metal containing material may include nickel or nickel platinum alloy. In alternative embodiments, the metal containing material may include cobalt, (Co), tungsten (W), titanium (Ti), tantalum (Ta), aluminum (Al), platinum (Pt), ytterbium (Yb), molybdenum (Mo), erbium (Er), or combinations thereof.

Figure 3A:
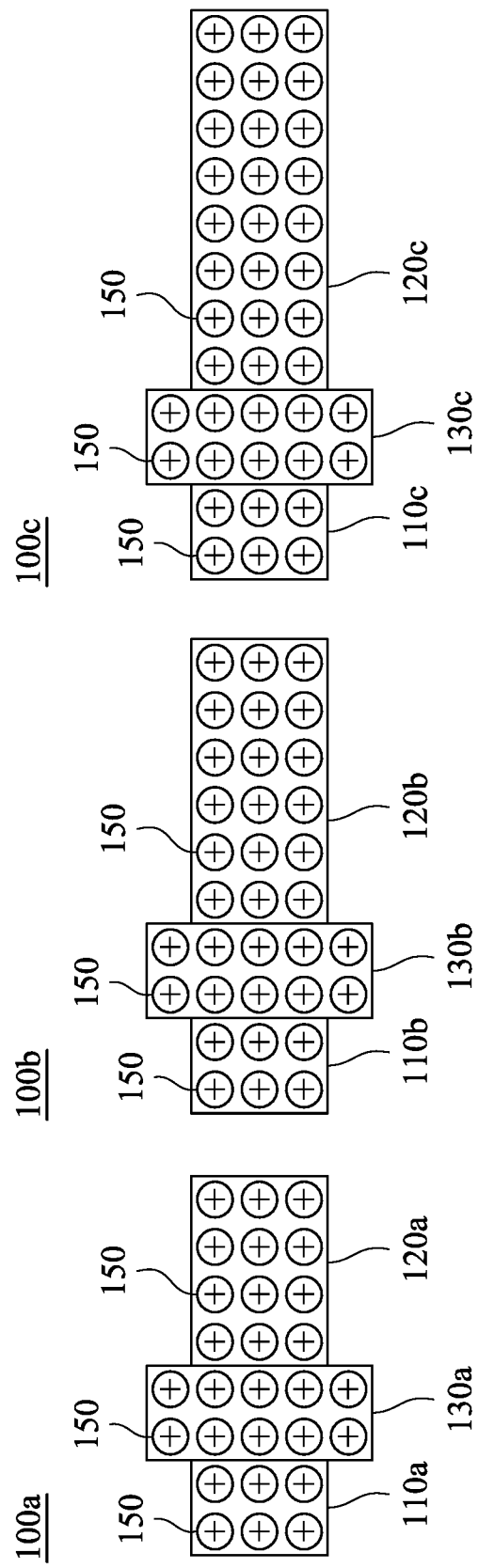
FIG. 3A and FIG. 3B respectively are top view and cross-sectional view of the test structure during a method of in-line estimating electrical property, in accordance with some embodiments of the present disclosure.
Figure 3B:
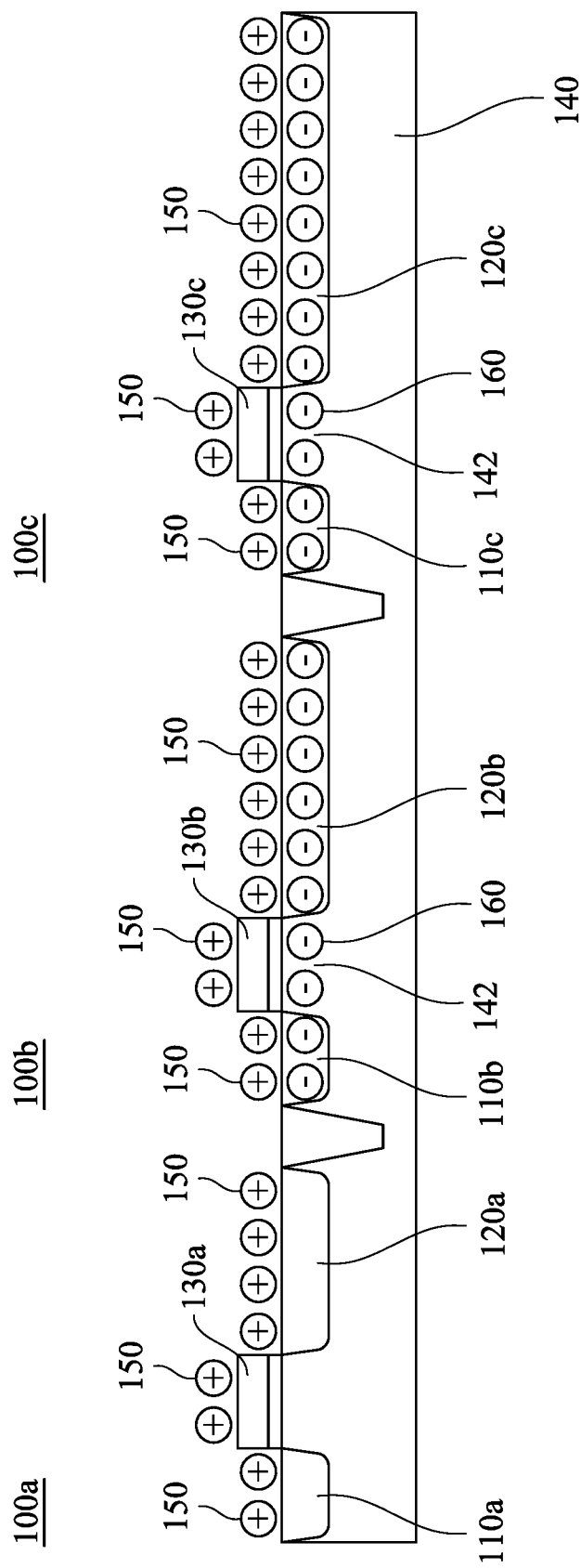

FIG. 3A and FIG. 3B respectively are top view and cross-sectional view of the test structure during a method of in-line estimating electrical property, in accordance with some embodiments of the present disclosure. As described previously, the test units 100a-100c are fabricated with substantially the same processes of fabricating the N-type semiconductor device, therefore, the electrical property of the test units 100a-100c may represent the electrical property of the N-type semiconductor device.

The method for in-line estimating electrical property of a semiconductor device includes performing an electron beam inspection process to apply a positive electric field onto the test structure and observe the state of the test structure. In some embodiments, electron beams irradiate onto the top surface of the test units 100a-100c, the electron beams are tuned to induce secondary electrons emit from the surface of the top surface of the test units 100a-100c. In some embodiments, the amount of the secondary electrons emit from the top surface of the test units 100a-100c is larger than the amount of the electrons irradiate onto the test units 100a-100c, such that the positive electric field is formed on the top surface of the test units 100a-100c.

In some embodiments, accumulation of positive charges 150 is present on the top surfaces of the source regions 110a-110c, the drain regions 120a-120c, and the gate regions 130a-130c. The charges 150 on the top surfaces are regarded as applying positive voltages to the corresponding source regions 110a-110c, the corresponding drain regions 120a-120c, and the corresponding gate regions 130a-130c. Since the areas of the drain regions 120a-120c are larger than the area of the source regions 110a-110c, voltages to drain regions 120a-120c are larger than voltages to the source regions 110a-110c. In some embodiments, the voltage to each of the source regions 110a-110c can be regarded as voltage to source (Vs), and the voltage to each of the drain regions 120a-120c can be regarded as voltage to drain (Vd). Therefore, a voltage bias is generated between the source regions 110a-110c and the corresponding drain regions 120a-120c in the test units 100a-100c.

The positive charges 150 on the gate regions 130a-130c can be regarded as applying positive voltages to the gate regions 130a-130c. The gate regions 130a-130c have sufficient large area, such that voltages to the gate regions 130a-130c are large enough and are larger than threshold voltages of the corresponding test units 100a-100c.

In some embodiments, such as in the test units 100b and 100c, the voltage biases between the source regions 110b-110c and the seconds active regions 120b-120c are large enough to open channels 142 under the gate regions 130b-130c. The electrons 160 in the semiconductor substrate 140 may be attracted and are present in the source regions 110b-110c, the drain regions 120b-120c, and the region between the source regions 110b-110c and the drain regions 120b-120c thereby opening the channels 142. Electrons 160 flow from the source regions 110b-110c to the drain regions 120b-120c through the channels 142 thereby generating currents. The top surface of the test unit 100b and 100c are filled with electrons 160. The test units 100b and 100c can be regarded as at a turn on mode.

In some other embodiments, such as in the test unit 100a, the voltage bias between the source region 110a and the drain region 120a is not large enough to open the channel under the gate region 130a. No current is generated between the source region 110a and the drain region 120a, and the test unit 100a can be regarded as at a turn off mode.

Figure 4:
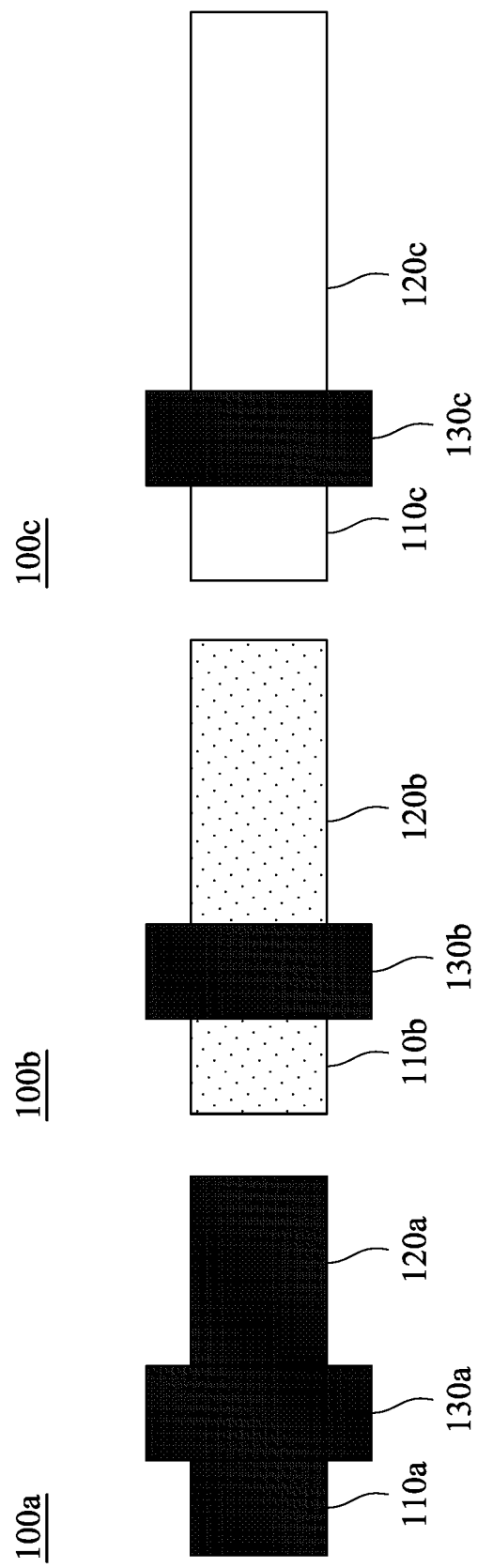
FIG. 4 is an estimating result of the test structure, in accordance with some embodiments of the present disclosure.

Reference is further made to FIG. 4, in which FIG. 4 is an estimating result of the test structure, in accordance with some embodiments of the present disclosure. The test structure such as the test structure discussed from FIG. 2A to FIG. 3B is further estimated by a detector. The detector estimates electrons on the top surface of the test units 100a-100c, in which the electrons are induced by electron beams and may include the secondary electrons emitted from the semiconductor substrate. The electrons induced by electron beams are present on the top surface of the semiconductor substrate during the channel is opened. The detector further converts signals obtained by the estimated electrons into a grayscale image signals. The grayscale image is displayed on an image module for estimating the test unit according to intensity of the electrons estimated by the detector. The regions corresponding to active regions of interest in the grayscale image are identified, and the electrical property of the semiconductor device is determined according to intensity of the regions of interest in the grayscale image. For example, the test units 100b and 100c are estimated as at a turn on mode (bright), and the test unit 100a is observed as at a turn off mode (dark).

The result of the estimating the test structure is further transmitted to a processor. The processor may further analyze the voltage bias to open the channel of the semiconductor device based on the test result of the test structure. Since the area differences between the source regions and the drain regions, and the power of the electron beams are predetermined, the voltage bias to open the channel the semiconductor device can be obtained accordingly. For example, the voltage bias to open the channel of the semiconductor device is at least equal to or larger than the voltage bias provided in test unit 100b.

Figure 5A:
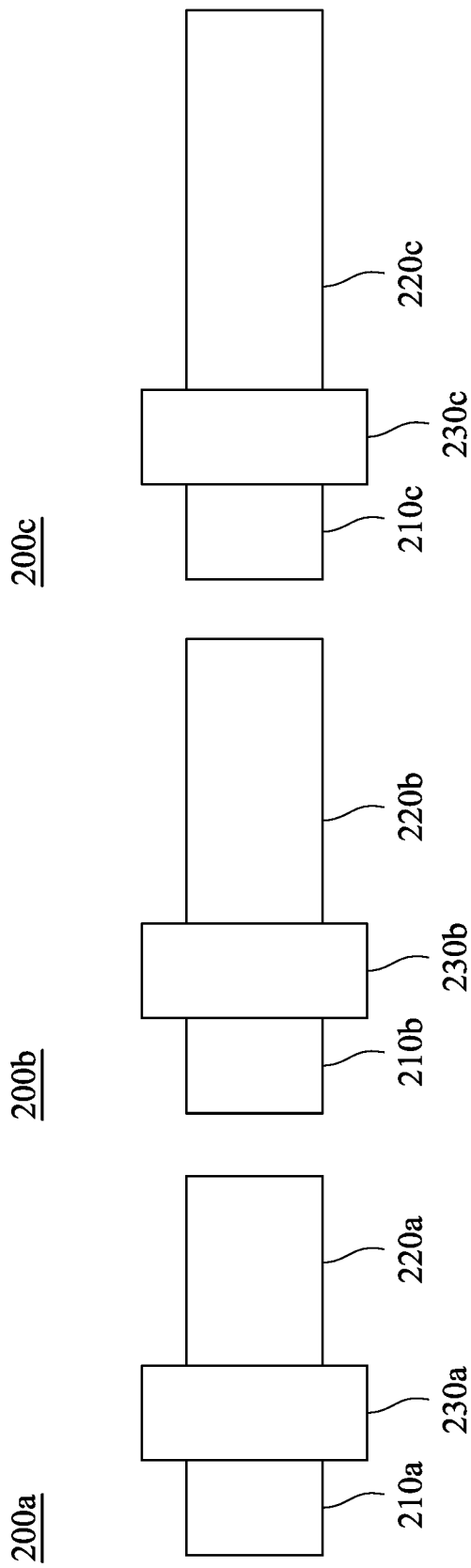
FIG. 5A and FIG. 5B respectively are top view and cross-sectional view of a test structure, in accordance with some embodiments of the present disclosure.
Figure 5B:
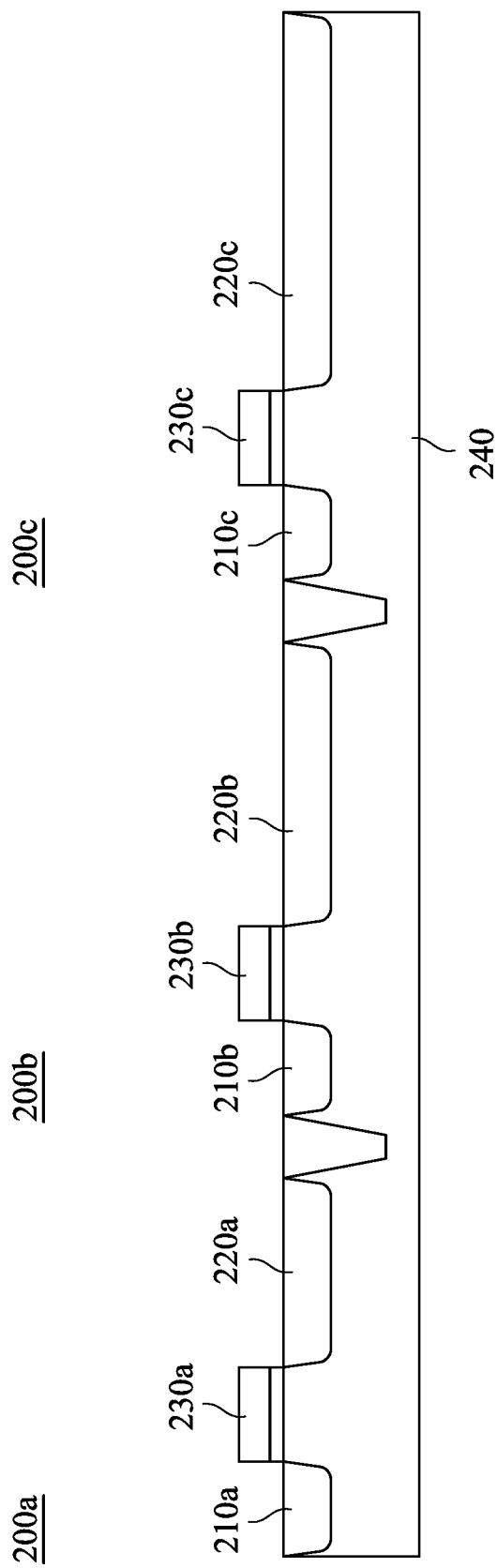

Reference is made to FIG. 5A and FIG. 5B. FIG. 5A and FIG. 5B respectively are top view and cross-sectional view of a test structure, in accordance with some embodiments of the present disclosure. The test structure includes a plurality of test units 200a-200c formed on the semiconductor substrate 240, in which the test units 200a-200c are fabricated with substantially the same processes of fabricating a semiconductor device, such that the electrical property of the test units 200a-200c may represent the electrical property of the semiconductor device. In some embodiments, the semiconductor device can be a P-type device. The semiconductor substrate 240 may include an N-type well, and source regions 210a-210c and second type active regions 220a-220c can be P-type active regions in the N-type well. The semiconductor substrate 240 further includes a plurality of shallow trench isolations to separate the test units 200a-200c. The P-type active regions can be lightly-doped drain/source (LDD) regions. The P-type active regions can be formed by implanting a P-type impurity (such as boron and/or indium) into the semiconductor substrate 240. In some other embodiments, the source regions 210a-210c and the drain regions 220a-220c can be epitaxy structures, depend on the semiconductor device. The gate regions 230a-230c between the source regions 210a-210c and the drain regions 220a-220c respectively include gate stacks, in which the gate stacks are made of metal containing material.

Figure 6A:
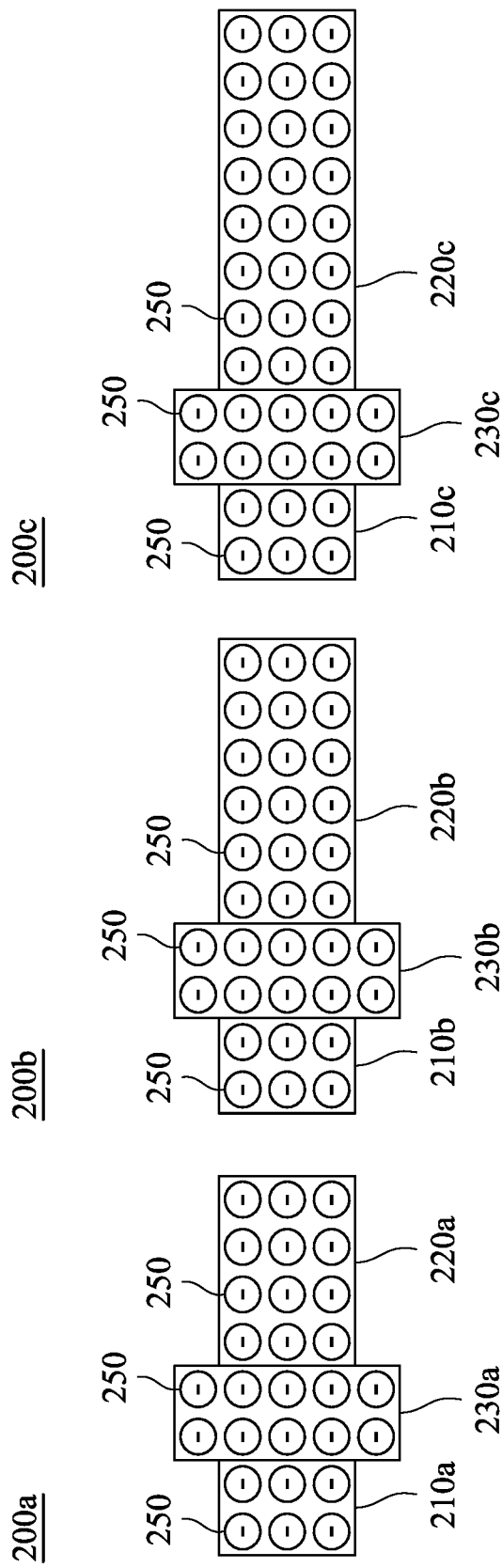
FIG. 6A and FIG. 6B respectively are top view and cross-sectional view of the test structure during a method of in-line estimating electrical property, in accordance with some embodiments of the present disclosure.
Figure 6B:
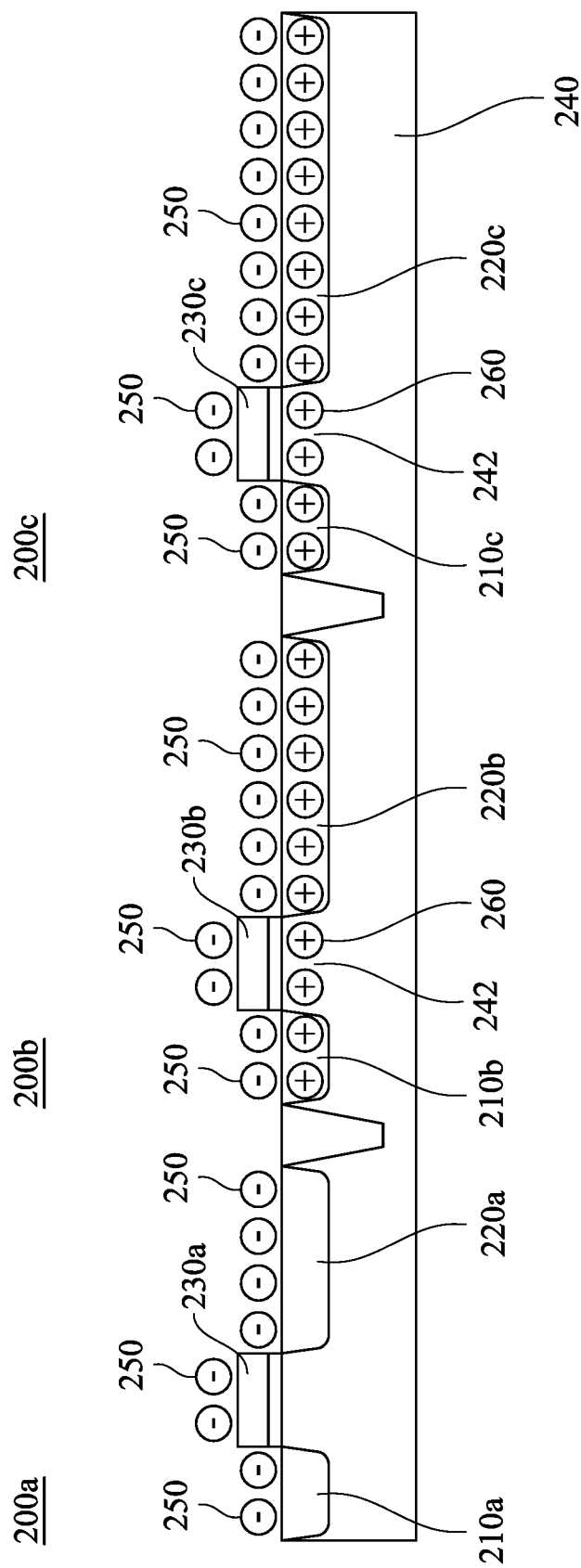

FIG. 6A and FIG. 6B respectively are top view and cross-sectional view of the test structure during a method of in-line estimating electrical property, in accordance with some embodiments of the present disclosure. As described previously, the test units 200a-200c are fabricated with substantially the same processes of fabricating the P-type semiconductor devices, therefore, the electrical property of the test units 200a-200c may represent the electrical property of the P-type semiconductor device.

An electron beam inspection process is performed to apply a negative electric field onto the test structure and observe the states of the test units 200a-200c. In some embodiments, accumulation of electrons 250 is adhered at the top surface of the semiconductor substrate 240 after electron beams irradiate onto the test structure. Therefore, the negative electric field is present on the test structure.

In some embodiments, the electrons 250 are present on the top surfaces of the source regions 210a-210c, the drain regions 220a-220c, and the gate regions 230a-230c. The electrons 250 on the top surfaces are regarded as applying negative voltages to the corresponding source regions 210a-210c, the corresponding drain regions 220a-220c, and the corresponding gate regions 230a-230c. Since the areas of the drain regions 220a-220c are larger than the area of the source regions 210a-210c, voltages to drain regions 220a-220c are larger than voltages to the source regions 210a-210c. Therefore, a voltage bias is generated between the source regions 210a-210c and the corresponding drain regions 220a-220c in the test units 200a-200c.

The electrons 250 on the gate regions 230a-230c can be regarded as applying negative voltages to the gate regions 230a-230c. The gate regions 230a-230c have sufficient large area, such that voltages to the gate regions 230a-230c are large enough and are larger than threshold voltages of the corresponding test units 200a-200c.

In some embodiments, such as in the test units 200b and 200c, the voltage biases between the source regions 210b-210c and the seconds active regions 220b-220c are large enough to open the channels 242 under the gate regions 230b-230c, thus electric holes 260 are attracted and are present in the source regions 210b-210c, the drain regions 220b-220c, and the region between the source regions 210b-210c and the drain regions 220b-220c thereby opening the channels 242. Electric holes 260 flow from the source regions 210b-210c to the drain regions 220b-220c through the channels 242. The test units 200b and 200c can be regarded as at a turn on mode.

In some other embodiments, such as the in the test unit 200a, the voltage bias between the source region 210a and the drain region 220a is not large enough to open the channel 242 under the gate region 230a. No current is generated between the source region 210a and the drain region 220a, and the test unit 200a can be regarded as at a turn off mode.

Figure 7:
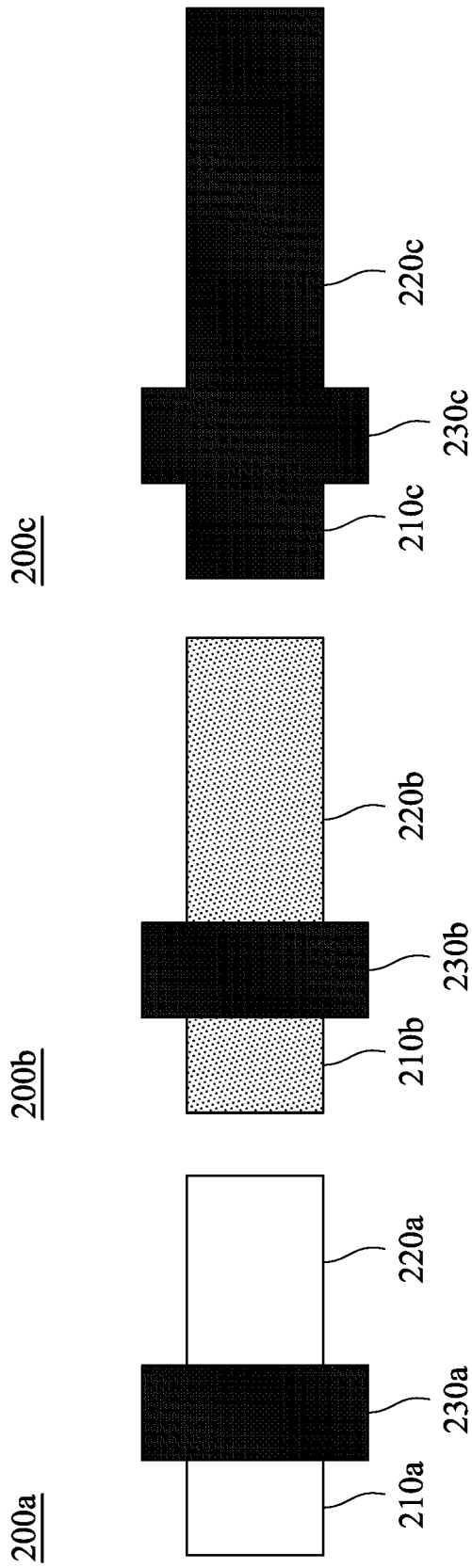
FIG. 7 is an estimating result of the test structure, in accordance with some embodiments of the present disclosure.

Reference is further made to FIG. 7, in which FIG. 7 is an estimating result of the test structure, in accordance with some embodiments of the present disclosure. The test structure such as the test structure discussed from FIG. 5A to FIG. 6B is further estimated by a detector. The detector estimates electrons on the top surface of the test units 200a-200c. The detector further converts signals obtained by the estimated electrons into a grayscale image signals. The grayscale image is displayed on an image module for estimating the test unit according to intensity of the electrons estimated by the detector. The regions corresponding to active regions of interest in the grayscale image are identified, and the electrical property of the semiconductor device is determined according to intensity of the regions of interest in the grayscale image. Since the test units 200a-200c are fabricated with substantially the same processes of fabricating the P-type semiconductor device, the electric holes are present at the top of the test unit when the test units, such as 200b-200c, are turned on, and densities of the electrons at the test units 200b-200c are smaller than the density of electrons at the test unit 200a. As a result, the test units 200b and 200c are observed as at a turn on mode (dark), and the test unit 200a is observed as at a turn off mode (bright).

The result of the estimating the test structure is further transmitted to a processor. The processor may further analyze the voltage bias to open the channel of the semiconductor device based on the test result of the test structure. Since the area differences between the source regions and the drain regions, and the power of the electron beams are predetermined, the voltage bias to open the channel the semiconductor device can be obtained accordingly. For example, the voltage bias to open the channel of the semiconductor device is at least equal to or larger than the voltage bias provided in test unit 200b.

The test structure is not limited to analyze the voltage bias of the semiconductor device. In some other embodiments, the test structure can be designed to analyze threshold voltage of the semiconductor device.

Figure 8:
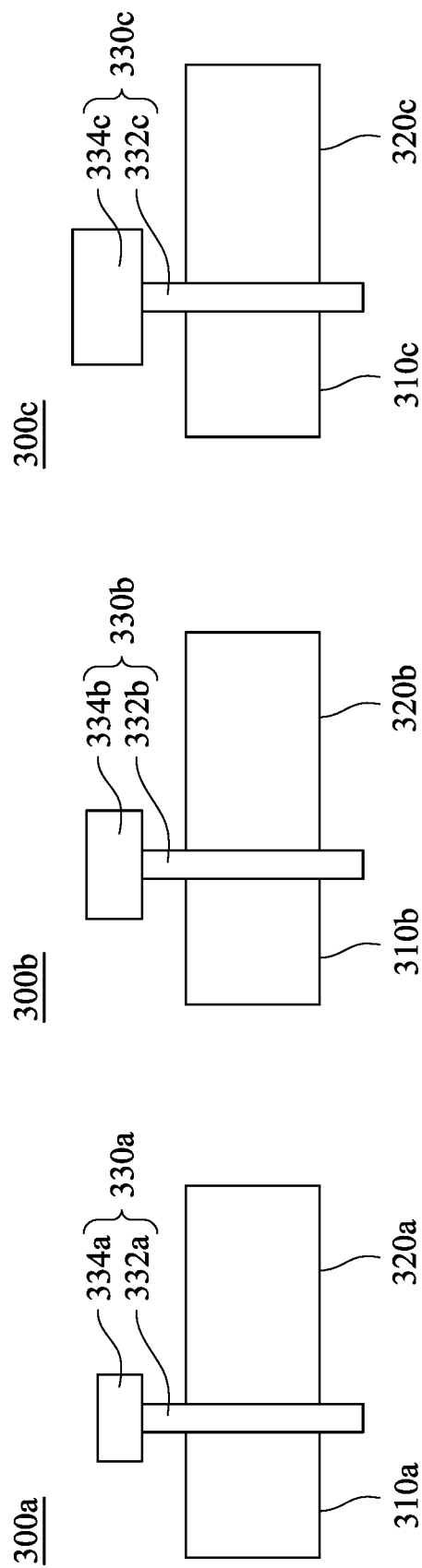
FIGS. 8-10 are schematic top views of a test structure, in accordance with different embodiments of the present disclosure.

FIG. 8 is a schematic top view of a test structure, in accordance with some embodiments of the present disclosure. The test structure includes a plurality of test units 300a-300c formed on a semiconductor substrate. The test units 300a-300c are fabricated with substantially the same process of fabricating a semiconductor device, in which the semiconductor device can be an N-type device or a P-type device. The test units 300a-300c respectively include source regions 310a-310c, drain regions 320a-320c, and gate regions 330a-330c therebetween.

For example, the test unit 300a includes the source region 310a, the drain region 320a, and the gate region 330a, in which the gate region 330a is present between the source region 310a and the drain region 320a, and the area of the drain region 320a is larger than the area of the source region 310a. The test unit 300b includes the source region 310b, the drain region 320b, and the gate region 330b, in which the gate region 330b is present between the source region 310b and the drain region 320b, and the area of the drain region 320b is larger than the area of the source region 310b. The test unit 300c includes the source region 310c, the drain region 320c, and the gate region 330c, in which the gate region 330c is present between the source region 310c and the drain region 320c, and the area of the drain region 320c is larger than the area of the source region 310c. In some embodiments, the source regions 310a-310c have substantially the same area, and the drain regions 320a-320c have substantially the same area. The area differences between the source regions 310a-310c and the drain regions 320a-320c are sufficient large enough, such that sufficient large voltage biases can be generated to open the channel of the test units 300a-300c.

The gate regions 330a-330c have different sizes. In some embodiments, the area of the gate region 330c is larger than the area of the gate regions 330b, and the area of the gate region 330b is larger than the area of the gate region 330a. In some embodiments, the gate regions 330a-330c respectively have body portions 332a-332c and pad portions 334a-334c, in which the body portions 332a-332c respective separates the source regions 310a-310c and the drain regions 320a-320c, and the pad portions 334a-334c are respectively connected to the body portions 332a-332c. In some embodiments, the body portions 332a-332c may have substantially the same area, the pad portion 334c is larger than the pad portion 334b, and the pad portion 334b is larger than the pad portion 334a, such that the area of the gate region 330c is larger than the area of the gate region 330b, and the area of the gate region 330b is larger than the gate region 330a.

The gate region 330c with larger area may get more voltage to gate than the gate region 330a with smaller area when the electron beams irradiate onto the test structure. Namely, the voltage to gate to the test unit 300c is larger than the voltage to gate to the test unit 300b, and the voltage to gate to the test unit 300b is larger than the voltage to gate to the test unit 300a when the electron beams irradiate onto the test structure.

Figure 9:
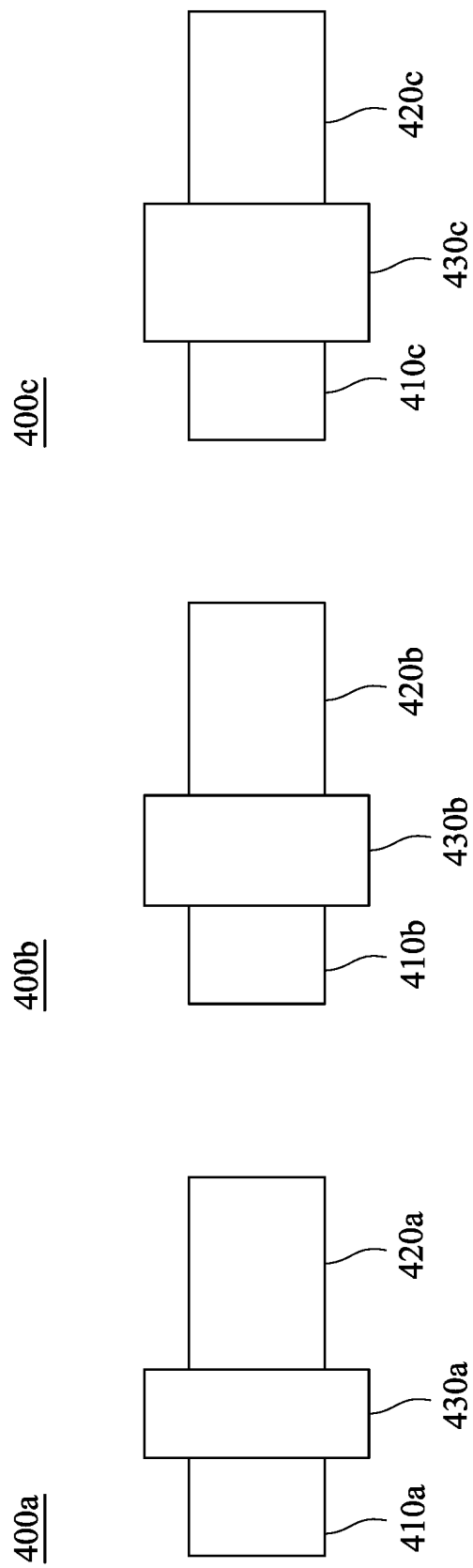

FIG. 9 is a schematic top view of a test structure, in accordance with some other embodiments of the present disclosure. The test structure includes a plurality of test units 400a-400c formed on a semiconductor substrate. The test units 400a-400c are fabricated with substantially the same process of fabricating a semiconductor device, in which the semiconductor device can be an N-type device or a P-type device. The test units 400a-400c respectively include source regions 410a-410c, drain regions 420a-420c, and gate regions 430a-430c therebetween.

In some embodiments, the areas of the drain regions 420a-420c are larger than the areas of the source regions 410a-410c, the source regions 410a-410c have substantially the same area, and the drain regions 420a-420c have substantially the same area. The area differences between the source regions 410a-410c and the drain regions 420a-420c are sufficient large enough, such that sufficient large voltage biases can be generated to open the channel of the test units 400a-400c.

In some embodiments, the gate regions 430a-430c are linear shaped. The gate regions 430a-430c are rectangular. The area of the gate region 430c is larger than the area of the gate region 430b, and the area of the gate region 430b is larger than the area of the gate region 430a. Namely, the channel lengths of the testing units 400a-400c are different. The gate region 430c with larger area may get more voltage to gate than the gate region 430a with smaller area when the electron beams irradiate onto the test structure. Namely, the voltage to gate to the test unit 400c is larger than the voltage to gate to the test unit 400b, and the voltage to gate to the test unit 400b is larger than the voltage to gate to the test unit 400a when the electron beams irradiate onto the test structure.

When the voltage to gate of any one of the test units 300a-300c and 400a-400c is larger than the threshold voltage thereof, the test unit would be observed as at a turn on mode. In some embodiments, the test unit is observed as bright at the turn on mode when the test unit and the corresponding semiconductor device are N-type device, while the test unit is observed as dark at the turn on mode when the test unit and the corresponding semiconductor device are P-type device. When the voltage to gate of the test unit is smaller than the threshold voltage of the test unit, the test unit would be observed as at a turn off mode. In some embodiments, the test unit is observed as dark at the turn off mode when the test unit and the corresponding semiconductor device are N-type device, while the test unit is observed as bright at the turn off mode when the test unit and the corresponding semiconductor device are P-type device.

Since the test units are fabricated with substantially the same processes of fabricating the semiconductor device, the electrical property of the test units may represent the electrical property of the semiconductor device. Since the area differences between the source regions and the drain regions, the areas of the gate regions, and the power of the electron beams are predetermined, the threshold voltage to open the channel the semiconductor device can be obtained accordingly. For example, the threshold voltage of the semiconductor device is at least equal to or larger than the minimum voltage to gate among the turned on test units.

Figure 10:
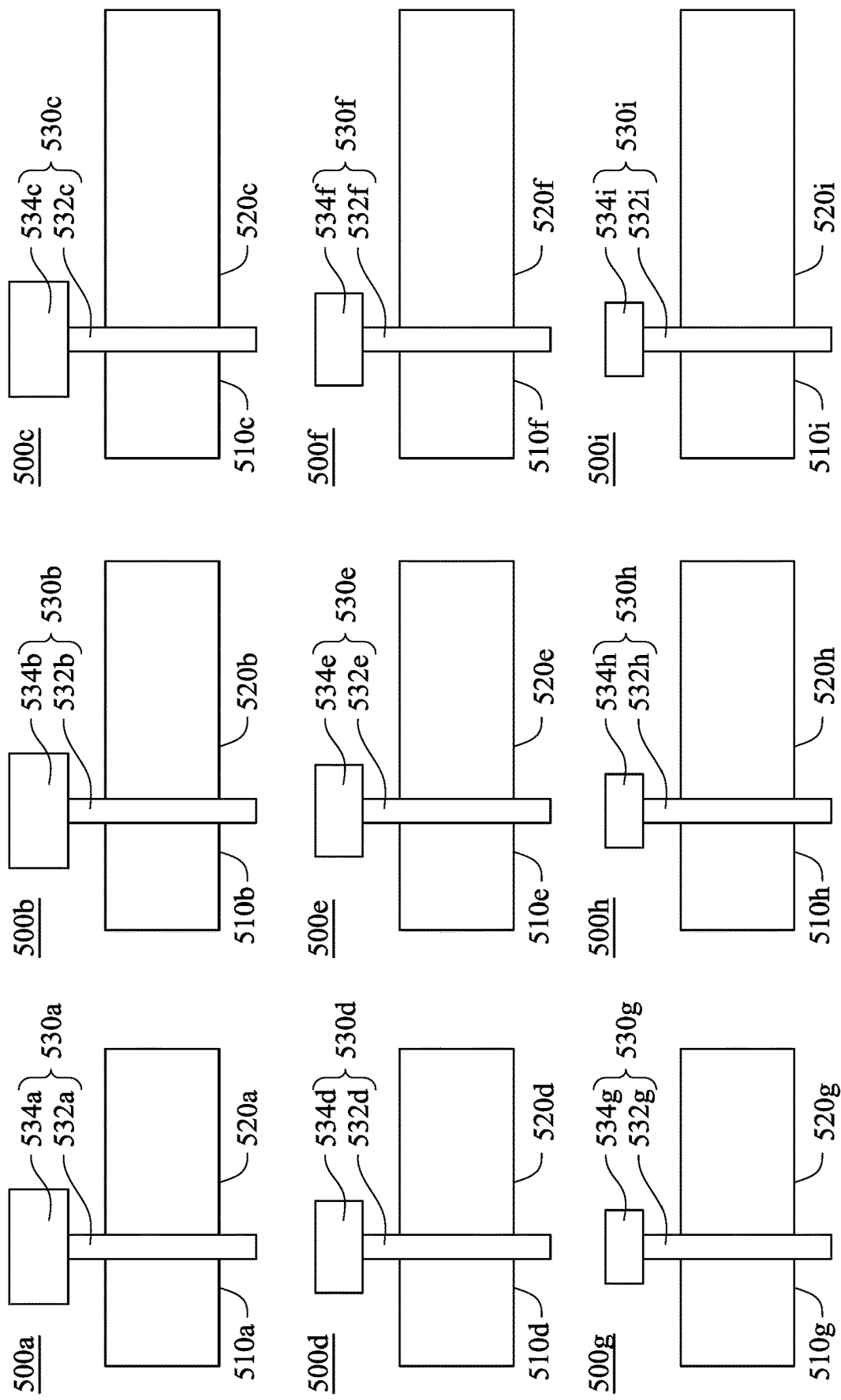

FIG. 10 is a schematic top view of a test structure, in accordance with some other embodiments of the present disclosure. The test structure includes a plurality of test units 500a-500i. In some embodiments, the test units 500a-500i are arranged in an array. The area differences between source regions 510a-510i and drain regions 520a-520i, the areas of gate regions 530a-530i are predetermined and are varied in row or in column. For example, the gate regions 530a-530i respectively include body portions 532a-532i and pad portions 534a-534i. The areas of the pad portions 534a-534i are adjusted to vary the areas of the gate regions 530a-530i.

Regarding to test units 500a, 500b, and 500c, the gate regions 530a, 530b, and 530c have substantially the same area, the source regions 510a, 510b, 510c have substantially the same area, the area of the drain regions 520c is larger than the area of the drain regions 520b, and the area of the second region 520b is larger than the area of the drain region 520a. Regarding to test units 500d, 500e, and 500f, the gate regions 530d, 530e, and 530f have substantially the same area, the source regions 510d, 510e, 510f have substantially the same area, the area of the drain regions 520f is larger than the area of the drain regions 520e, and the area of the second region 520e is larger than the area of the drain region 520d. Regarding to test units 500g, 500h, and 500i, the gate regions 530g, 530h, and 530i have substantially the same area, the source regions 510g, 510h, 510i have substantially the same areas, the area of the drain regions 520i is larger than the area of the drain regions 520h, and the area of the second region 520h is larger than the area of the drain region 520g.

Regarding to the test unit 500a, 500d, and 500g, the source regions 510a, 510d, and 510g have substantially the same area, the drain regions 520a, 520d, and 520g have substantially the same area, and the areas of the drain regions 520a, 520d, and 520g are larger than the areas of the source regions 510a, 510d, and 510g. The area of the gate regions 530a is larger than the area of the gate region 530d, and the area of the gate region 530d is larger than the area of the gate region 530g. Regarding to the test unit 500b, 500e, and 500h, the source regions 510b, 510e, and 510h have substantially the same area, the drain regions 520b, 520e, and 520h have substantially the same area, and the areas of the drain regions 520b, 520e, and 520h are larger than the areas of the source regions 510b, 510e, and 510h. The area of the gate regions 530b is larger than the area of the gate region 530e, and the area of the gate region 530e is larger than the area of the gate region 530h. Regarding to the test unit 500c, 500f, and 500i, the source regions 510c, 510f, and 510i have substantially the same area, the drain regions 520c, 520f, and 520i have substantially the same area, and the areas of the drain regions 520c, 520f, and 520i are larger than the areas of the source regions 510c, 510f, and 510i. The area of the gate regions 530c is larger than the area of the gate region 530f, and the area of the gate region 530f is larger than the area of the gate region 530i.

Figure 11:
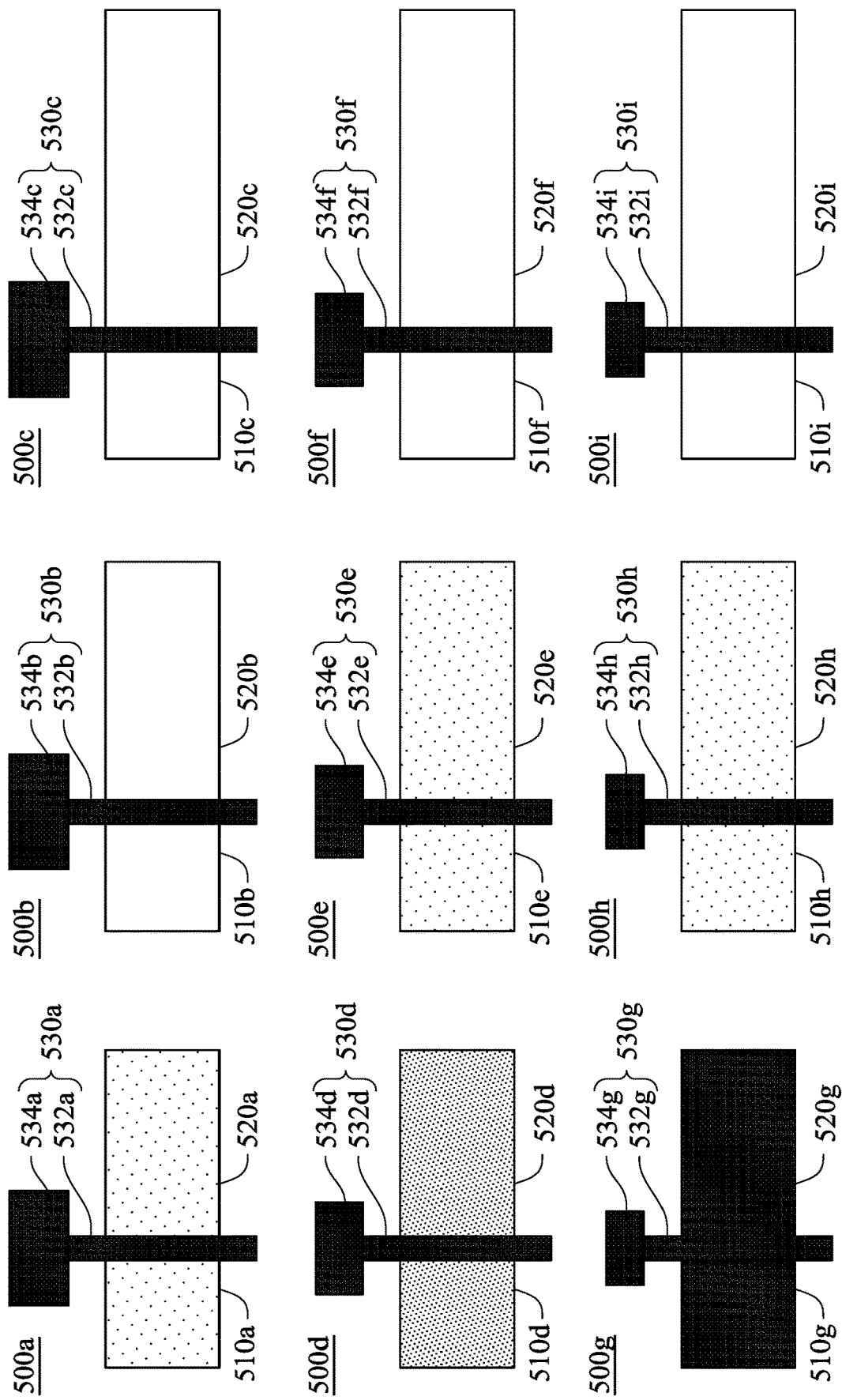
FIG. 11 is an estimating result of the test structure, in accordance with some embodiments of the present disclosure.

FIG. 11 is an estimating result of the test structure, in accordance with some embodiments of the present disclosure. The electron beam inspection is performed to the test structure, such as the test structure discussed in FIG. 10. In some embodiments, the test units 500a-500i and the corresponding semiconductor device are N-type devices. Some of the test units 500a-500i, such as the test units 500a, 500b, 500c, 500e, 500f, 500h, 500i are observed as bright and are determined as at turn on mode. The areas of the source regions 510a-510i, the drain regions 520a-520i, and the gate regions 530a-530i are predetermined, and the power of the electron beams is also predetermined. The threshold voltages corresponding to the voltage biases of the semiconductor device can be obtained accordingly. In some other embodiments, the test units 500a-500i and the corresponding semiconductor device can be P-type devices.

Figure 12:
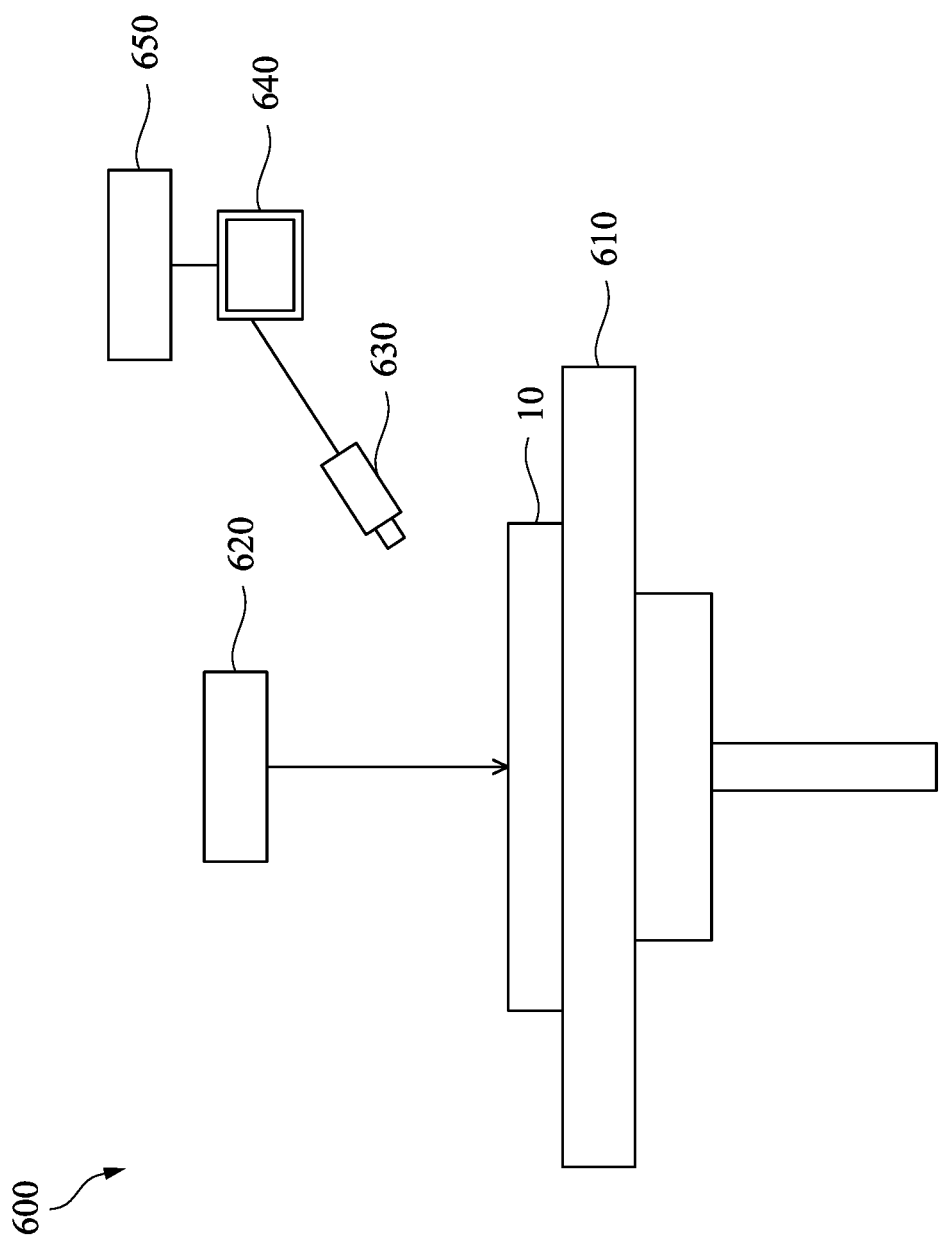
FIG. 12 is a schematic diagram of an apparatus for estimating at least one electrical property of a semiconductor device, in accordance with some embodiments of the disclosure.

FIG. 12 is a schematic diagram of an apparatus for estimating electrical property of a semiconductor device, in accordance with some embodiments of the disclosure. The apparatus 600 includes a platen 610, an electron beam source 620, a detector 630, an image module 640, and a processor 650. The platen 610 is configured to allow a wafer 10 to be disposed thereon. The electron beam source 620 generates and directs electron beams onto the test units on the wafer. In some embodiments, the electron beam source 620 can optionally include an electron source unit, an alignment octupole, a reflector, a variable aperture, a filter, and a lens group. The detector 630 can be any suitable detector sensitive to electrons including the secondary electrons induced by the electron beams. The signals of electrons are transmitted from the detector 630 to the image module 640. The image module 640 converts the electrons estimated by the detector 630 into a grayscale image. The processor 650 is electrically connected to the image module 640 to receive the grayscale image. The processor 650 is programmed to estimate the electrical property of the semiconductor device according to the grayscale image, in which the grayscale image represents intensity of the electrons estimated by the detector 630. The processor 650 determines the state, such as being turned on or turned off, of the test units. The processor 650 further calculates electrical property, such as threshold voltages and voltage biases of the turned on test units.

The test units are fabricated with substantially the same processes of fabricating the semiconductor device, such that the electrical property of the test units may represent the electrical property of the semiconductor device. The electrical property, such as voltage bias and/or threshold voltage of the test units can be estimated by performing an electron beam inspection process. The electron beam inspection process can be performed before the interconnection structures are formed on the semiconductor device, such that defects of the semiconductor device can be estimated before the interconnection structures are formed.

According to some embodiments of the disclosure, a method for estimating at least one electrical property of a semiconductor device is provided. The method includes forming the semiconductor device and at least one testing unit on a substrate, irradiating the testing unit with at least one electron beam, estimating electrons from the testing unit induced by the electron beam, and estimating the electrical property of the semiconductor device according to intensity of the estimated electrons from the testing unit.

According to some embodiments of the disclosure, a method for fabricating a semiconductor structure is provided. The method includes forming at least one device active region in a die area of a substrate, and forming at least one first test active region and at least one second test active region external to the die area of the substrate. The method further includes forming at least one device gate on the device active region, at least one first test gate on the first test active region, and at least one second test gate on the second test active region. The first test gate and the second test gate are different in size.

According to some embodiments of the disclosure, an apparatus for estimating at least one electrical property of a semiconductor device is provided. The apparatus includes a platen, and electron beam source, a detector, and a processor. The platen allows a wafer to be disposed thereon. The electron beam source is configured to provide at least one electron beam onto at least one testing unit on the wafer. The detector is sensitive to electrons from the testing unit induced by the electron beam. The processor is programmed to estimate the electrical property of the semiconductor device on the wafer according to intensity of the electrons estimated by the detector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a device active region in a die area of a substrate, wherein the device active region comprises a device drain region;
a first test active region comprising a first test drain region;
a second test active region comprising a second test drain region;
a third test active region comprising a third test drain region;
a fourth test active region comprising a fourth test drain region, wherein:
the first test active region, the second test active region, the third test active region, and the fourth test active region are external to the die area of the substrate,
the first test active region is adjacent to the second test active region in a first direction,
the third test active region is adjacent to the first test active region in a second direction not parallel to the first direction,
the fourth test active region is adjacent to the first test active region in a third direction not parallel to the first direction and not parallel to the second direction,
the first test drain region and the second test drain region are different in area,
the first test drain region and the third test drain region are equal in area, and
the second test drain region and the fourth test drain region are equal in area;
a device gate region on the device active region;
a first test gate region on the first test active region; and
a second test gate region on the third test active region, wherein:
the first test gate region and the second test gate region are different in area,
the first test gate region comprises a body portion and a pad portion having a different width than a width of the body portion of the first test gate region, and
the second test gate region comprises a body portion and a pad portion having a different width than a width of the body portion of the second test gate region.

2. The semiconductor structure of claim 1, comprising:
a fifth test active region external to the die area of the substrate and comprising a fifth test drain region, wherein the first test drain region, the second test drain region, and the fifth test drain region are arranged in a line.

3. The semiconductor structure of claim 2, wherein:
the second test drain region is between the first test drain region and the fifth test drain region, and
the second test drain region is larger in area than the first test drain region and smaller in area than the fifth test drain region.

4. The semiconductor structure of claim 1, wherein:
the first test active region comprises a first test source region,
the second test active region comprises a second test source region, and
the first test source region and the second test source region are equal in area.

5. The semiconductor structure of claim 1, wherein:
the first test active region comprises a first test source region,
the second test active region comprises a second test source region,
a first area difference between the first test source region and the first test drain region is larger than a second area difference between the second test source region and the second test drain region.

6. The semiconductor structure of claim 1, comprising:
a third test gate region on the second test active region, wherein the first test gate region and the third test gate region are equal in area.

7. The semiconductor structure of claim 1, wherein the first test active region and the second test active region are in a scribe region of the substrate.

8. The semiconductor structure of claim 1, wherein the pad portion of the first test gate region is adjacent to the body portion of the first test gate region when moving in the second direction.

9. The semiconductor structure of claim 1, wherein:
the width of the pad portion of the first test gate region and the width of the body portion of the first test gate region are measured in the first direction, and the width of the pad portion of the second test gate region and the width of the body portion of the second test gate region are measured in the first direction.

10. The semiconductor structure of claim 1, comprising:
a fifth test active region external to the die area of the substrate, wherein:
the fifth test active region is adjacent to the second test active region in the first direction,
the first test active region and the third test active region are equal in area,
the first test active region and the second test active region are different in area,
the fifth test active region and the second test active region are different in area, and
the fifth test active region and the first test active region are different in area;
a third test gate region on the second test active region; and
a fourth test gate region on the fifth test active region, wherein:
the first test gate region and the third test gate region are equal in area, and
the fourth test gate region and the third test gate region are equal in area.

11. The semiconductor structure of claim 1, comprising a third test gate region on the fourth test active region, wherein the second test gate region and the third test gate region are equal in area.

12. A semiconductor structure, comprising:
a device active region in a die area of a substrate;
a first test active region;
a second test active region;
a third test active region;
a fourth test active region; and
a fifth test active region, wherein:
the first test active region, the second test active region, the third test active region, the fourth test active region, and the fifth test active region are in a scribe region of the substrate,
the first test active region is adjacent to the second test active region in a first direction,
the third test active region is adjacent to the first test active region in a second direction not parallel to the first direction,
the fifth test active region is adjacent to the first test active region in a third direction not parallel to the first direction and not parallel to the second direction,
the fourth test active region is adjacent to the second test active region in the first direction,
the first test active region and the third test active region are equal in area,
the first test active region and the second test active region are different in area,
the fourth test active region and the second test active region are different in area, and
the fourth test active region and the first test active region are different in area;
a first test gate region crossing the first test active region;
a second test gate region crossing the second test active region;
a third test gate region crossing the third test active region;
a fourth test gate region crossing the fourth test active region; and
a fifth test gate region crossing the fifth test active region, wherein:
the first test gate region and the third test gate region are different in area,
the first test gate region and the second test gate region are equal in area,
the fourth test gate region and the second test gate region are equal in area, and
the fifth test gate region and the third test gate region are equal in area.

13. The semiconductor structure of claim 12, wherein the first test gate region comprises a body portion and a pad portion.

14. The semiconductor structure of claim 13, wherein the pad portion of the first test gate region has a different width than a width of the body portion of the first test gate region.

15. The semiconductor structure of claim 13, wherein:
the third test gate region comprises a body portion and a pad portion, and
the pad portion of the first test gate region and the pad portion of the third test gate region are different in area.

16. A semiconductor structure, comprising:
a device active region in a die area of a substrate, wherein the device active region comprises a device drain region;
a first test active region comprising a first test drain region;
a second test active region comprising a second test drain region;
a third test active region comprising a third test drain region;
a fourth test active region comprising a fourth test drain region, wherein:
the first test active region, the second test active region, the third test active region, and the fourth test active region are external to the die area of the substrate,
the first test active region is adjacent to the second test active region in a first direction,
the third test active region is adjacent to the first test active region in a second direction not parallel to the first direction,
the fourth test active region is adjacent to the first test active region in a third direction not parallel to the first direction and not parallel to the second direction,
the first test drain region is smaller in area than the second test drain region,
the first test drain region and the third test drain region are equal in area, and
the second test drain region and the fourth test drain region are equal in area;
a device gate region on the device active region;
a first test gate region on the first test active region; and
a second test gate region on the third test active region, wherein:
the first test gate region and the second test gate region are different in area,
the first test gate region comprises a body portion and a pad portion having a different width than a width of the body portion of the first test gate region, and
the second test gate region comprises a body portion and a pad portion having a different width than a width of the body portion of the second test gate region.

17. The semiconductor structure of claim 16, comprising:
a fifth test active region external to the die area of the substrate and comprising a fifth test drain region, wherein the first test drain region, the second test drain region, and the fifth test drain region are arranged in a line.

18. The semiconductor structure of claim 17, wherein:
the second test drain region is between the first test drain region and the fifth test drain region, and
the second test drain region is formed to be smaller in area than the fifth test drain region.

19. The semiconductor structure of claim 16, wherein:
the first test active region comprises a first test source region,
the second test active region comprises a second test source region, and
the first test source region and the second test source region are equal in area.

20. The semiconductor structure of claim 16, wherein:
the first test active region comprises a first test source region,
the second test active region comprises a second test source region, and
a first area difference between the first test source region and the first test drain region is larger than a second area difference between the second test source region and the second test drain region.

* * * * *